(12) United States Patent
Colinge et al.

(10) Patent No.: US 10,361,270 B2
(45) Date of Patent: Jul. 23, 2019

(54) NANOWIRE MOSFET WITH DIFFERENT SILICIDES ON SOURCE AND DRAIN

(71) Applicant: Taiwan Semiconductor Manufacturing Company Limited, Hsinchu (TW)

(72) Inventors: Jean-Pierre Colinge, Hsinchu (TW); Cheng-Tung Lin, Hsinchu County (TW); Kuo-Cheng Ching, Hsinchu County (TW); Carlos H. Diaz, Mountain View, CA (US)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/084,680

(22) Filed: Nov. 20, 2013

(65) Prior Publication Data

US 2015/0137067 A1    May 21, 2015

(51) Int. Cl.
*H01L 29/06* (2006.01)
*H01L 29/41* (2006.01)
(Continued)

(52) U.S. Cl.
CPC .......... *H01L 29/0676* (2013.01); *B82Y 10/00* (2013.01); *B82Y 40/00* (2013.01);
(Continued)

(58) Field of Classification Search
CPC ............. H01L 29/66439; H01L 29/413; H01L 29/6659; H01L 29/66575–29/66606;
(Continued)

(56) References Cited

U.S. PATENT DOCUMENTS

| 6,383,906 B1 * | 5/2002 | Wieczorek | H01L 21/28518 |
| | | | 257/E21.165 |
| 2005/0136605 A1 * | 6/2005 | Murto | H01L 21/28097 |
| | | | 438/303 |

(Continued)

FOREIGN PATENT DOCUMENTS

| CN | 102832221 | 12/2012 |
| KR | 0327347 | 3/2002 |

(Continued)

OTHER PUBLICATIONS

Larrieu, G., Han, X.-L.; Vertical Nanowire Array-Based Field Effect Transistors for Ultimate Scaling; Nanoscale, 5; pp. 2437-2441; 2013.

(Continued)

*Primary Examiner* — Xinning (Tom) Niu
*Assistant Examiner* — Sean P Hagan
(74) *Attorney, Agent, or Firm* — McDermott Will & Emery LLP

(57) ABSTRACT

A nanowire field effect transistor (FET) device and method for forming a nanowire FET device are provided. A nanowire FET including a source region and a drain region is formed. The nanowire FET further includes a nanowire that connects the source region and the drain region. A source silicide is formed on the source region, and a drain silicide is formed on the drain region. The source silicide is comprised of a first material that is different from a second material comprising the drain silicide.

20 Claims, 13 Drawing Sheets

(51) Int. Cl.
  *H01L 29/66* (2006.01)
  *H01L 29/78* (2006.01)
  *H01L 29/775* (2006.01)
  *B82Y 10/00* (2011.01)
  *B82Y 40/00* (2011.01)
  *H01L 29/16* (2006.01)
  *H01L 21/265* (2006.01)

(52) U.S. Cl.
  CPC ............ *H01L 29/16* (2013.01); *H01L 29/413* (2013.01); *H01L 29/66439* (2013.01); *H01L 29/775* (2013.01); *H01L 29/7827* (2013.01); *H01L 21/26586* (2013.01); *H01L 29/66666* (2013.01)

(58) Field of Classification Search
  CPC ......... H01L 21/28052; H01L 29/66666; H01L 21/02603; H01L 29/0676
  See application file for complete search history.

(56) References Cited

U.S. PATENT DOCUMENTS

| | | | |
|---|---|---|---|
| 2008/0150026 A1 | 6/2008 | Kwon et al. | |
| 2010/0210079 A1* | 8/2010 | Masuoka | H01L 29/42392 438/156 |
| 2010/0213539 A1* | 8/2010 | Masuoka | H01L 21/84 257/329 |
| 2011/0062523 A1* | 3/2011 | Masuoka | H01L 21/823814 257/368 |
| 2011/0140195 A1* | 6/2011 | Zahurak | H01L 27/105 257/329 |
| 2013/0240983 A1* | 9/2013 | Larrieu | B82Y 10/00 257/329 |

FOREIGN PATENT DOCUMENTS

| | | |
|---|---|---|
| KR | 0669664 | 1/2007 |
| KR | 20120139067 | 12/2012 |

OTHER PUBLICATIONS

Vandooren, Anne, Leonelli, D., Rooyackers, R., Arstila, K., Groeseneken, G., Huyghebaert, C.; Impact of Process and Geometrical Parameters on the Electrical Characteristics of Vertical Nanowire Silicon n-TFETs; Journal of Solid-State Electronics, 72; pp. 82-87; 2012.

Korean Office Action; Application No. 10-2014-0124286; dated Nov. 19, 2015.

Korean Notice of Allowance; Application No. 10-2014-0124286; dated Feb. 18, 2016.

Chinese Office Action; Application No. 201410045813.2; dated Feb. 27, 2017.

Office Action issued in corresponding Chinese Application No. 201410045813.2, dated Sep. 11, 2017.

Saraswat: Interconnections: Silicides; EE311 Class Notes, Stanford, CA; [retrieved from the internet on Jan. 30, 2014]; <https://web.stanford.edu/class/ee311/Notes/Silicides.pdf>.

* cited by examiner

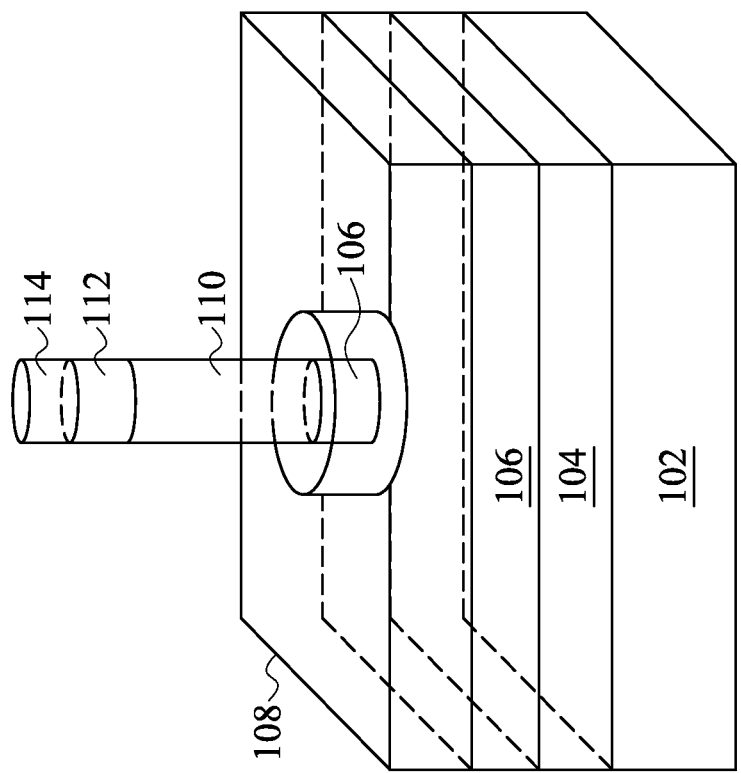
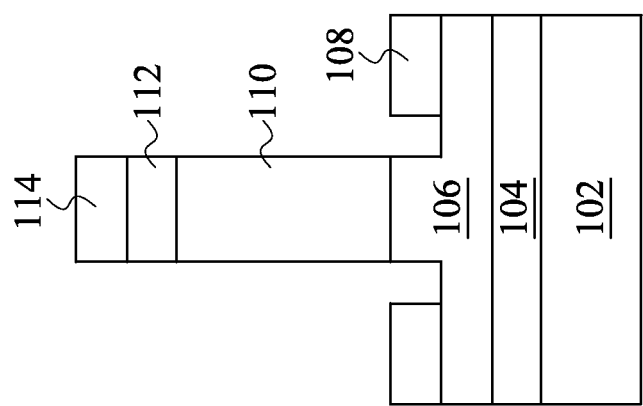
Fig. 1B
Fig. 1A

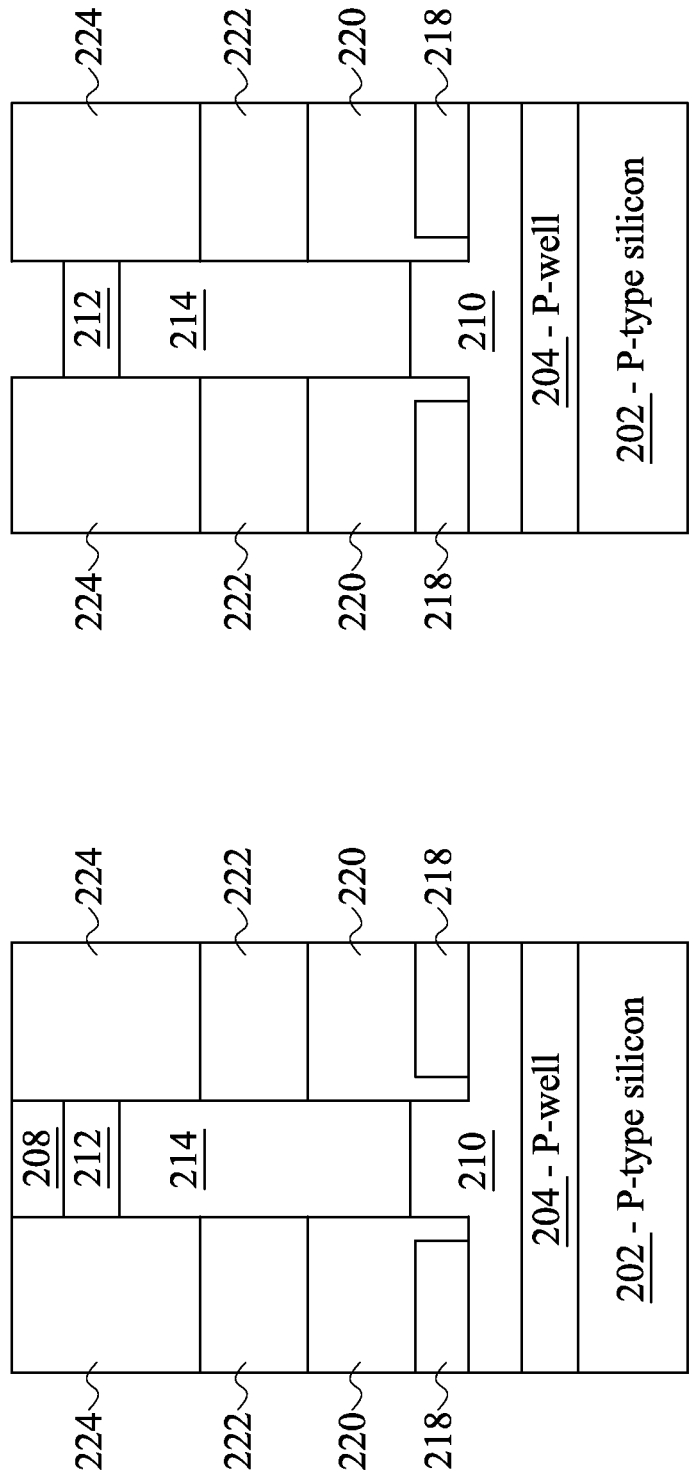

NANOWIRE MOSFET WITH DIFFERENT SILICIDES ON SOURCE AND DRAIN

TECHNICAL FIELD

The technology described in this disclosure relates generally to nanowire-based devices and more particularly to nanowire-based field-effect transistors (FETs) and techniques for the fabrication thereof.

BACKGROUND

Gate-all-around (GAA) nanowire channel field-effect transistors (FETs) may enable feature scaling beyond current planar complementary-metal-oxide semiconductor (CMOS) technology. Nanowire channel FETs may also be of interest due to their electrostatics, which may be superior to those of conventional FET devices. The fabrication of nanowire channel FETs may include generating a collection of nanowires and placing them where desired (e.g., a bottom-up approach) or may include various lithographic patterning procedures (e.g., a top-down approach).

SUMMARY

The present disclosure is directed to a nanowire field effect transistor (FET) device and a method for forming a nanowire FET device. In a method for forming a nanowire FET device, a nanowire FET including a source region and a drain region is formed. The nanowire FET further includes a nanowire that connects the source region and the drain region. A source silicide is formed on the source region, and a drain silicide is formed on the drain region. The source silicide is comprised of a first material that is different from a second material comprising the drain silicide.

In another example, in a method for forming a nanowire FET device, a well of a first conductivity type is formed in a semiconductor substrate. A plurality of nanowires are formed, where the nanowires have i) first ends, and ii) second ends opposite the first ends. Each of the nanowires extends perpendicularly from the well at the first end. A hard mask is provided over the plurality of nanowires, where the hard mask is adjacent to the second ends of the nanowires. A dopant implantation is performed to form source regions and drain regions of the plurality of nanowire FETs. The drain regions are disposed at the second ends of the nanowires, and the source regions include a portion of the well that is doped to a second conductivity type as a result of the dopant implantation. A source silicide is formed over the portion of the well comprising the source regions, where the hard mask prevents the first silicide from forming on the drain regions. A gate stack and one or more dielectric layers are formed over the well, where the gate stack and the one or more dielectric layers surround the plurality of nanowires. A drain silicide is formed over the drain regions, where the drain silicide is comprised of a first material that is different from a second material comprising the source silicide.

In another example, a nanowire FET device includes a source region and a drain region. The nanowire FET device further includes a nanowire formed in a semiconductor material, where the nanowire comprises a channel that connects the source region and the drain region. The nanowire FET device also includes a source silicide formed on the source region and a drain silicide formed on the drain region. The source silicide is comprised of a first material that is different from a second material comprising the drain silicide.

BRIEF DESCRIPTION OF THE FIGURES

FIGS. 1A and 1B depict a vertical nanowire field effect transistor (FET) having a source silicide and a drain silicide, where the source silicide and the drain silicide are comprised of different materials.

FIG. 2I depicts a second ILD layer formed substantially over the gate stack.

FIG. 2J depicts a removal of the hard mask from the structure.

DETAILED DESCRIPTION

Figure 1C:
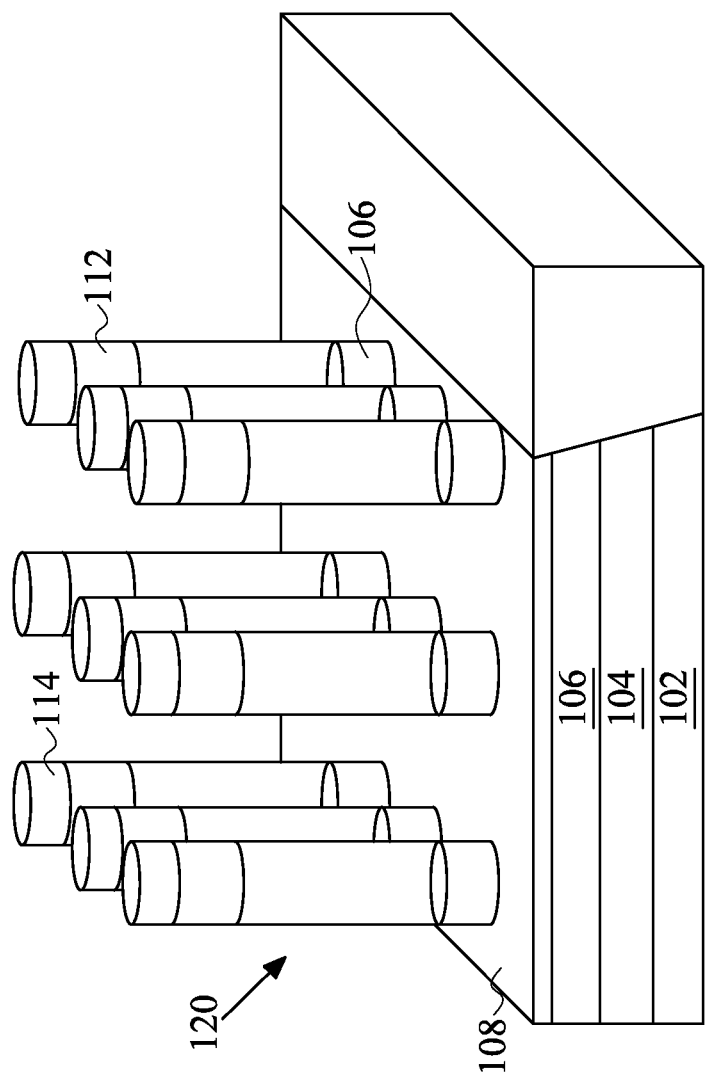
FIG. 1C depicts a plurality of vertical nanowire FETs, where each of the FETs uses two silicide materials.

FIGS. 1A and 1B depict a vertical nanowire field effect transistor (FET) having a source silicide 108 and a drain silicide 114, where the source silicide 108 and the drain silicide 114 are comprised of different materials. As depicted in FIGS. 1A and 1B, the nanowire FET may include a source region 106, a drain region 112, and a nanowire channel 110 that connects the source and drain regions 106, 112. The nanowire channel 110 may comprise a silicon nanowire, among other types. The nanowire FET may be fabricated substantially over a substrate 102 and may extend in a substantially perpendicular manner from a well 104 formed in the substrate 102. The substrate 102 may be a bulk P-type silicon substrate, and the well 104 formed in the substrate may be a P-type well (e.g., a well with a higher P-type doping as compared to the substrate 102). The well 104 may be formed via an ion implantation process.

FIG. 1A may depict a cross-sectional view of an example intermediate stage in the fabrication of the nanowire FET, and FIG. 1B may depict a three-dimensional view of the example intermediate stage. As illustrated in FIGS. 1A and 1B, the source region 106 of the nanowire FET may include i) a first portion at a first end of the nanowire channel 110, and ii) a second portion that is within the well 104. The first and second portions of the source region may further be illustrated in FIG. 2C, described below, which references a first portion of a source region 210 at a first end of a nanowire 206, and a second portion of the source region 210 within a well 204. The drain region 112 may be formed at a second end of the nanowire channel 110 that is opposite the first end. In a completely fabricated state, a gate (not depicted in FIGS. 1A and 1B) may surround (e.g., wrap) the nanowire channel 110, where the gate may be used to regulate current flow through the nanowire channel 110 between the source and drain regions 106, 112.

As depicted in FIGS. 1A and 1B, the source silicide 108 may be formed substantially over the source region 106. In particular, the source silicide 108 may be formed substantially over the second portion of the source region 106 (i.e., the portion of the source region 106 that is formed within the well 104) and may not be formed over the first portion of the source region 106 (i.e., the portion of the source region 106 that is formed at the first end of the nanowire channel 110). The drain silicide 114 may be formed on the drain region 112, such that the drain silicide 114 may be disposed substantially on top of the nanowire. The source silicide 108 and the drain silicide 114 may be of different geometries, where the source silicide 108 may include portions that resemble a planar thin film (e.g., as depicted in FIG. 1B, illustrating the source silicide 108 as a planar thin film with a patterned opening for the nanowire) and the drain silicide 114 may include only a small region that is disposed substantially atop of the nanowire. In selecting the materials and other parameters (e.g., thickness, fabrication processes, etc.) for the source and drain silicides 108, 114, the varying geometries of the silicides 108, 114 may be taken into consideration.

In addition to being of different geometries, the source silicide 108 and the drain silicide 114 may undergo different processing. For example, as described above, a gate stack (not depicted in FIGS. 1A and 1B) may surround the nanowire channel 110. In fabricating the structure, the source silicide 108 may be formed during a first period of time, the gate stack may be formed during a second period of time that follows the first period of time, and the drain silicide 114 may be formed during a third period of time that follows the second period of time. Due to this sequence used in the fabrication process, the source silicide 108 may be exposed to a higher thermal budget as compared to the drain silicide 114. In selecting the materials and other parameters for the source and drain silicides 108, 114, the different thermal budgets applied to the silicides 108, 114 may be taken into consideration.

The source silicide 108 may be comprised of a first material, and the drain silicide 114 may be comprised of a second material that is different from the first material. By contrast, in conventional FET fabrication processes, the silicide on the source and the drain of the transistor may be of a same type (i.e., the silicides may have a same chemical composition and may be made of a same material). As described above, in a vertical nanowire transistor (e.g., the vertical nanowire transistor depicted in FIGS. 1A and 1B), the source silicide 108 may be formed before a gate stack is formed, and the drain silicide 114 may be formed after the gate stack is formed. The source and drain silicides 108, 114 may therefore be exposed to a different thermal budget. Further, as explained above, the geometry (e.g., size and shape) of the silicided source 108 may be different from the geometry of the silicided drain 114 in the vertical nanowire transistor. Due to these differences in processing and geometry, the optimization requirements may be different for the source suicide 108 and the drain suicide 114.

By using the two different materials for the source and drain silicides 108, 114, device performance optimization can be performed by taking into account the different thermal budgets and geometries of the silicides 108, 114. Such performance optimization may be impossible or difficult if a single silicide material is used for the source and drain silicides 108, 114. The formation and stability of a given silicide may be dependent on the thermal budget (e.g., during and after silicide formation) and on the geometry of the area on which the silicide is formed. Using the two different materials for the silicides 108, 114 may increase processing flexibility and allow for the aforementioned device performance optimization.

In the example of FIG. 1, the source silicide 108 may be optimized for the higher thermal budget. Materials for the source silicide 108 that may be configured to withstand the higher thermal budget applied may include $MoSi_2$, $WSi_2$, $TiSi_2$, $TaSi_2$, and $NiCoSi_2$. The drain silicide 114 may be optimized for sitting atop of the nanowire. Materials for the drain silicide 114 that may be adapted to sit atop of a nanowire may include $NiSi_2$ and $PtSi_2$. It is noted that although the example of FIG. 1 is described in terms of the source region 106 that is disposed at the bottom of the nanowire channel 110 and the drain region 108 that is disposed at the top of the nanowire channel 110, in other examples, the source and drain regions may be switched (e.g., such that the source region is disposed at the top of the nanowire channel 110, and the drain region is disposed at the bottom of the nanowire channel 110). In such other examples, the source silicide material may be optimized for sitting atop the nanowire, and the drain silicide material may be optimized for the higher thermal budget.

Locations of the source and drain regions depend on a direction of current flow and a bias applied to the transistor, such that the locations of the source and the drain may be swapped by changing the bias applied to the transistor. Therefore, references to a "source silicide" in this disclosure should be understood as referring to, more generally, a "bottom silicide," in light of the fact that the drain region may be located at a bottom of the transistor in some examples. Similarly, references to a "drain silicide" in this disclosure should be understood as referring to, more generally, a "top silicide," in light of the fact that the source silicide may be located at a top of the transistor in some examples.

FIG. 1C depicts a plurality of vertical nanowire FETs 120, where each of the FETs 120 uses two different silicide materials (i.e., a first material for the source silicide 108 and a second material for the drain silicide 114, where the second material is different than the first material). As in the example of FIGS. 1A and 1B, the nanowire FETs 120 of FIG. 1C may be fabricated substantially over the substrate 102, where the substrate may include the well region 104 from which nanowires extend. In a completely fabricated state, a gate (not depicted in FIG. 1C) may surround (e.g., wrap) the nanowires, where the gate may be used to regulate current flow between the source and drain regions 106, 112. FIG. 1C may illustrate that a plurality of FETs 120 may be formed and arranged in an array pattern (as depicted in FIG. 1C) or in various other patterns substantially over the substrate 102.

Figure 2B:
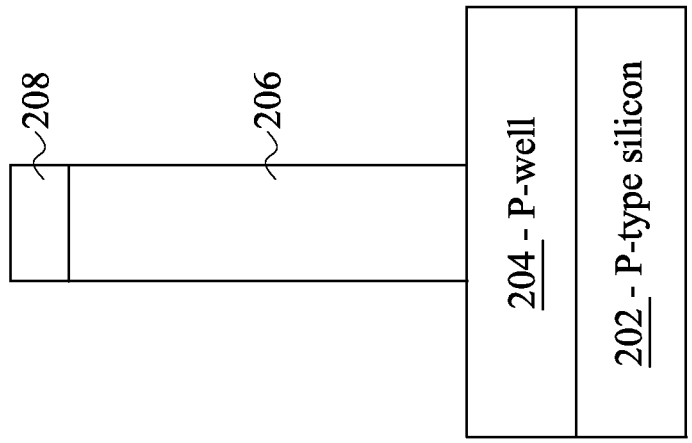
FIG. 2B depicts a hard mask formed substantially atop the nanowire.
Figure 2A:
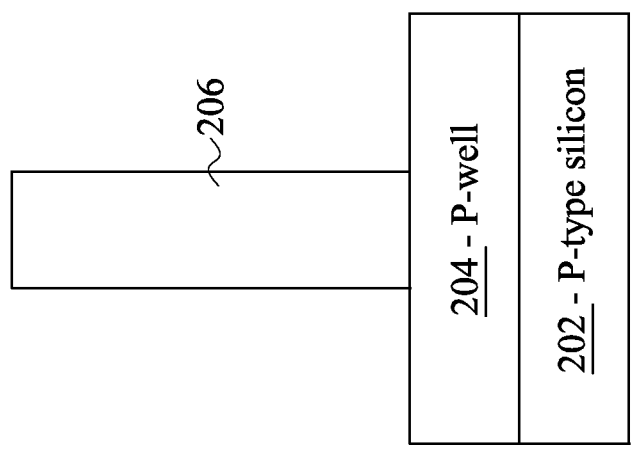
FIG. 2A depicts a nanowire extending perpendicularly from a well formed in a substrate.

FIGS. 2A-2L are diagrams illustrating an example method for fabricating a nanowire FET with different materials for the source silicide and the drain silicide. Specifically, FIGS. 2A-2L may depict cross-sectional views of example intermediate stages in the fabrication of the nanowire FET. FIG. 2A depicts a nanowire 206 extending perpendicularly from a well 204 that is formed in a substrate 202. The substrate 202 may be, for example, a bulk silicon substrate, and the well 204 may have a first conductivity type that is the same as that of the substrate 202. In the example of FIG. 2A, the substrate 202 may be a P-type silicon substrate, and the well 204 may be a P-type well. In other examples, the substrate 202 may be a bulk N-type silicon substrate, and the well 204 may be an N-type well. Various other substrate/well configurations may be used (e.g., configurations where the well 204 has a conductivity type that is different from that of the substrate 202). In general, the substrate 202 may be any type of semiconductor substrate upon which the well 204 and the nanowire 206 may be formed. The nanowire 206 may comprise a silicon nanowire, among other types. In one example, the nanowire 206 may be formed by masking the substrate 202 and/or the well 204 and performing an etch process to produce the nanowire 206.

FIG. 2B depicts a hard mask 208 formed substantially atop the nanowire 206. The hard mask 208 may be, for example, a nitride hard mask, an oxide hard mask, or a variety of other types of hard masks. As described in further detail below, with respect to FIG. 2F, the hard mask 208 may be used to prevent a source silicide (e.g., a source silicide 218 in the example of FIG. 2F) from forming on a drain region of the nanowire. Thus, the hard mask 208 may include any hard mask material that achieves this purpose.

Figure 2D:
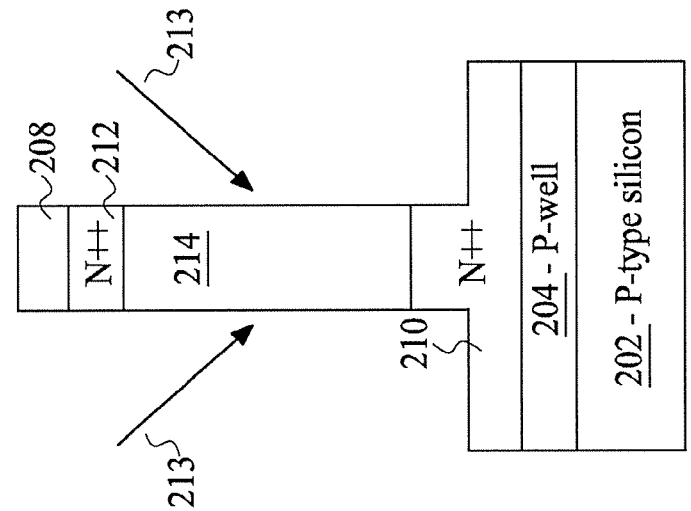
FIG. 2D depicts a tilted dopant implantation used form a channel along the nanowire, where the channel electrically connects the source region and the drain region.
Figure 2C:
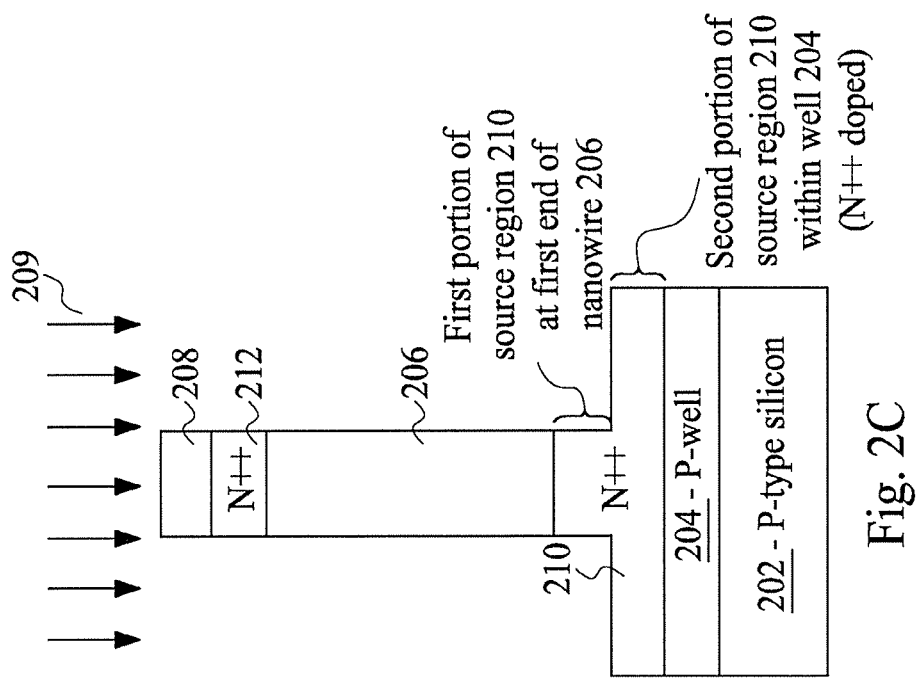
FIG. 2C depicts a vertical dopant implantation and diffusion process used to form a source region and a drain region of a nanowire FET.

FIG. 2C depicts a vertical dopant implantation and diffusion process (symbolized by arrows 209) used to form a source region 210 and a drain region 212 of a nanowire FET. The dopant implantation and diffusion process may cause the source region 210 and the drain region 212 to have a conductivity type that is different from that of the substrate 202 and/or the well 204. Thus, in the example of FIG. 2C, where the substrate 202 and the well 204 both have the first conductivity type that is P-type, the dopant implantation and diffusion process may cause the source region 210 and the drain region 212 to have a second conductivity type that is N-type. This is illustrated in FIG. 2C, where the source and drain regions 210, 212 are depicted as being of conductivity type "N++."

The nanowire 206 may have a first end (i.e., near the substrate 202) and a second end that is opposite the first end (i.e., at the top of the nanowire 206 and adjacent to the hard mask 208), and the nanowire 206 may extend perpendicularly from the well 204 at the first end. The vertical dopant implantation and diffusion process may form the drain region 212 at the second end of the nanowire 206. The vertical dopant implantation and diffusion process may also form the source region 210, where the source region 210 may include i) a first portion at the first end of the nanowire 206, and ii) a second portion in the well 204. Forming the second portion of the source region 210 in the well 204 may cause this portion of the well 204 to change from a P-type conductivity type to an N++ conductivity type, as illustrated in FIG. 2C. The vertical dopant implantation of FIG. 2C may be termed a shallow implantation.

FIG. 2D depicts a tilted dopant implantation used form a channel 214 along the nanowire, where the channel 214 may electrically connect the source region 210 and the drain region 212. The dopant implantation (symbolized by arrows 213) may be performed at a tilt angle to form a doped channel 214 along the nanowire (e.g., N+ doped, N doped, or P doped). A diffusion process may be used in conjunction with the tilted dopant implantation to form the N+ channel 214.

Figure 2E:
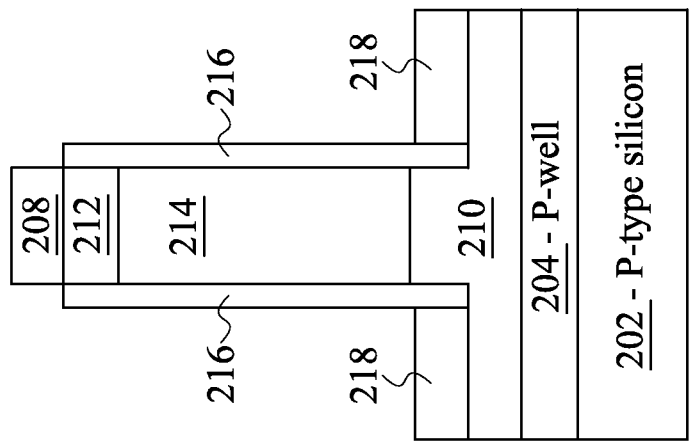
FIG. 2E depicts spacer material formed along the nanowire.

FIG. 2E depicts spacer material 216 formed along the nanowire. The spacer material 216 may be, for example, a nitride spacer, an oxide spacer, or another type of spacer material. Although the cross-sectional view of FIG. 2E may depict the spacer material 216 as only being disposed at two sides of the nanowire, it should be understood that a three-dimensional view of the structure may depict the spacer material 216 as surrounding all sides of the nanowire.

Figure 2F:
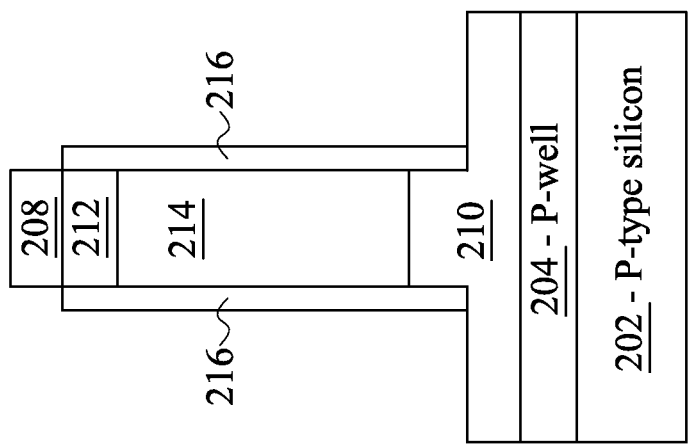
FIG. 2F depicts the formation of a source silicide substantially over a portion of the source region.
Figure 2H:
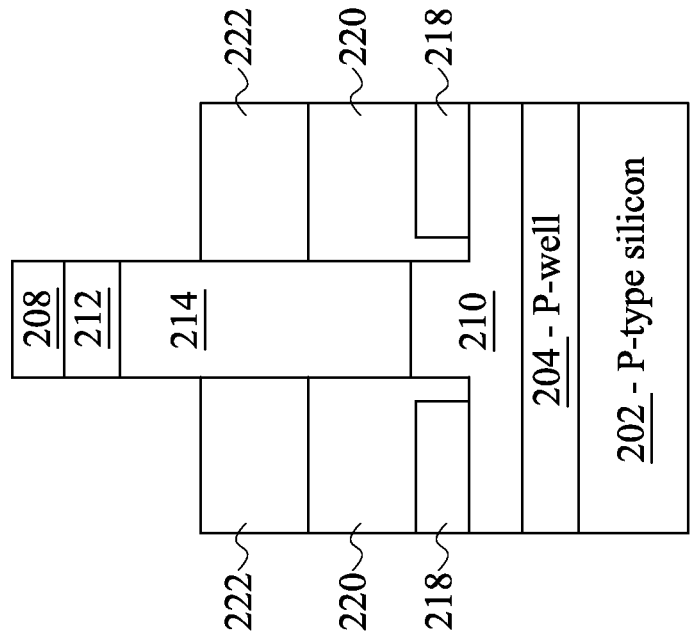
FIG. 2H depicts a first inter-layer dielectric (ILD) layer and a gate stack that surround the nanowire.

FIG. 2F depicts the formation of a source silicide 218 substantially over a portion of the source region 210. In forming the source silicide 218, a first silicide metal may be deposited substantially over the structure, and the structure may thereafter be annealed to react the first silicide metal. The first silicide metal for the source silicide 218 may be, for example, NiCo, Ti, or another metal. Specifically, the first metal used to form the source silicide 218 may be a metal that is configured to withstand a higher thermal budget. As described above with reference to FIGS. 1A and 1B, the source silicide 218 may be formed prior to the formation of a gate stack (e.g., a gate stack 222 as depicted in FIG. 2H) and prior to the formation of a drain silicide (e.g., a drain silicide 228 as depicted in FIG. 2L). The additional processing to which the source silicide 218 may be subjected may cause a higher thermal budget to be applied to the source silicide 218, as compared to the drain silicide. Thus, in determining the first silicide metal for the source silicide 218, a metal that is configured to withstand the higher thermal budget and maintain stability may be selected.

As described above, the first silicide metal may be deposited substantially over the structure, and the structure may thereafter be annealed to react the first silicide metal. The reacted metal may form the source silicide 218 that is configured to withstand the higher thermal budget, where the source silicide 218 may include $MoSi_2$, $WSi_2$, $TiSi_2$, $TaSi_2$, or $NiCoSi_2$. Unreacted metal may be stripped from the structure. As depicted in FIG. 2F, after reacting the first silicide metal and stripping the unreacted metal, the source silicide 218 may be formed only over the second portion of the source region 210 that has been formed in the well 204. The hard mask 208 may be used to prevent the source silicide 218 from forming on the drain region 212 of the nanowire (e.g., metal deposited on the hard mask 208 or other non-reactive surfaces may be unreacted metal that is stripped from the structure).

Figure 2G:
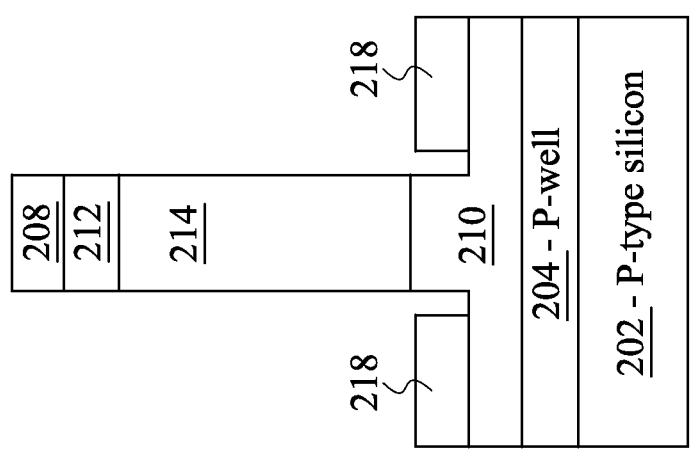
FIG. 2G depicts the structure following a removal of the spacer material.
Figure 2L:
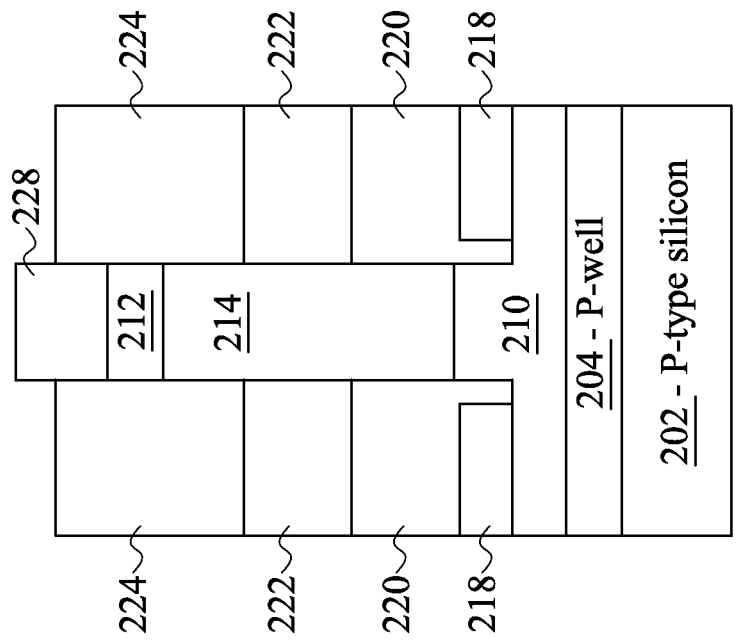
FIG. 2L depicts a drain silicide formed substantially over the drain region.

FIG. 2G depicts the structure following a removal of the spacer material 216. Removing the spacer material 216 may cause the nanowire to be disposed in an opening in the source silicide 218. For example, although the source silicide 218 may be in contact with the source region 210 of the FET, the nanowire itself may not be in physical contact with the source silicide 218 following the removal of the spacer material 216. The opening in the source silicide 218 may be illustrated in the example of FIG. 1B, where a circular opening in the source silicide 108 is shown surrounding the nanowire.

FIG. 2H depicts a first inter-layer dielectric (ILD) layer 220 and a gate stack 222 that substantially surround the nanowire. The first ILD layer 220 may be deposited substantially over the source silicide 218 and planarized via a chemical mechanical planarization (CMP) process. The ILD layer 220 may be an oxide layer or another suitable inter-layer dielectric material. After the CMP process, the gate stack 222 may be formed substantially over the ILD layer 220. The gate stack 222 may comprise, for example, oxide, high-k dielectric, TiN, TaN, TaC, polysilicon, tungsten, or aluminum, among other materials. Although the cross-sectional view of FIG. 2H may depict the first ILD layer 220 and the gate stack 222 as only being disposed at two sides of the nanowire, it should be understood that a three-dimensional view of the structure may depict the ILD layer 220 and the gate stack 222 as surrounding all sides of the nanowire. Because the gate stack 222 may surround (e.g., wrap) the nanowire in this manner, the nanowire FET of FIGS. 2A-2L may be termed a gate-all-around (GAA) nanowire FET.

FIG. 2I depicts a second ILD layer 224 formed substantially over the gate stack 222. The second ILD layer 224 may be planarized via a CMP process and may be an oxide layer or another suitable inter-layer dielectric material. Although the example of FIG. 2I depicts the second ILD layer 224 as being deposited to a thickness that makes the second ILD layer 224 substantially level with a top surface of the hard mask 208, in other examples, the second ILD layer 224 may be more thick or less thick. In one example, the second ILD layer 224 may have a thickness that causes the second ILD layer 224 to be substantially level with a top surface of the drain region 212. In another example, the second ILD layer 224 may have a thickness that causes the hard mask 208 to be recessed a distance in the ILD layer 224.

FIG. 2J depicts a removal of the hard mask 208 from the structure. The hard mask 208 may be removed via a conventional dry etch technique, for example.

Figure 2K:
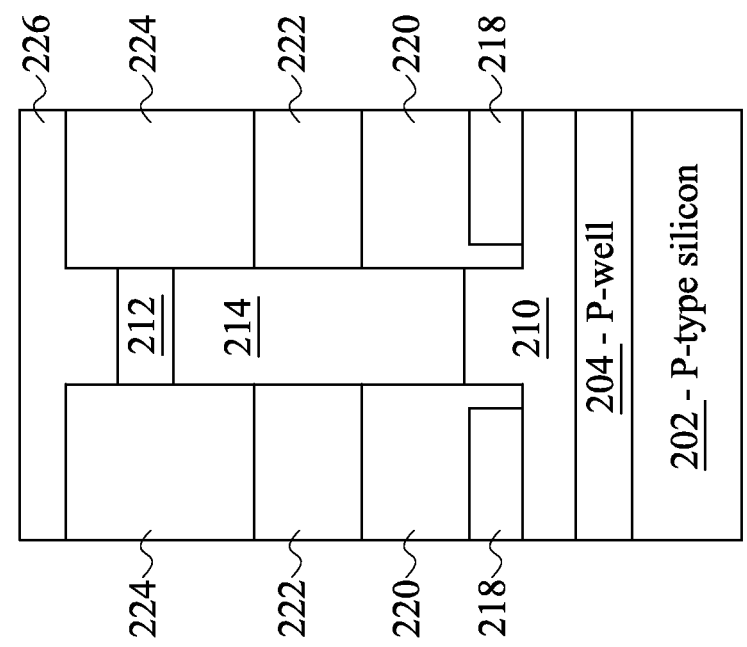
FIG. 2K depicts a deposition of a second silicide metal over the structure, where the second silicide metal is formed substantially over the drain region and the second ILD layer.

FIG. 2K depicts a deposition of a second silicide metal 226 over the structure, where the second silicide metal 226 is formed substantially over the drain region 212 and the second ILD layer 224. The second silicide metal 226 for the drain silicide may be, for example, Ni or another metal. The second silicide metal 226 used to form the drain silicide may be a metal that is configured to be placed substantially on top of a nanowire.

FIG. 2L depicts a drain silicide 228 formed substantially over the drain region 212. In forming the drain silicide 228, the second silicide metal 226 may be deposited substantially over the structure (e.g., as depicted in FIG. 2K), and the structure may thereafter be annealed to react the second silicide metal 226. The reacted metal may form the drain silicide 228 that is adapted to be placed substantially on top of the nanowire, where the drain silicide 228 may include $NiSi_2$ or $PtSi_2$, among other materials. Unreacted metal may be stripped from the structure, such that the drain silicide 228 is formed only over the nanowire, as depicted in FIG. 2L. The ILD layers 220, 224 and the gate stack 222 may prevent the drain silicide 228 from forming on portions of the source region 210.

In the example of FIGS. 2A-2L, the material of the source silicide 218 may be different from the material of the drain silicide 228. By using the two different materials for the silicides 218, 228, the silicides 218, 228 may be optimized for performance. For example, as described above, the source silicide 218 (e.g., comprising $MoSi_2$, $WSi_2$, $TiSi_2$, $TaSi_2$, or $NiCoSi_2$, for example) may be optimized for a higher thermal budget, and the drain silicide 228 (e.g., comprising $NiSi_2$ or $PtSi_2$, for example) may be optimized for sitting on top of a nanowire.

Figure 3:
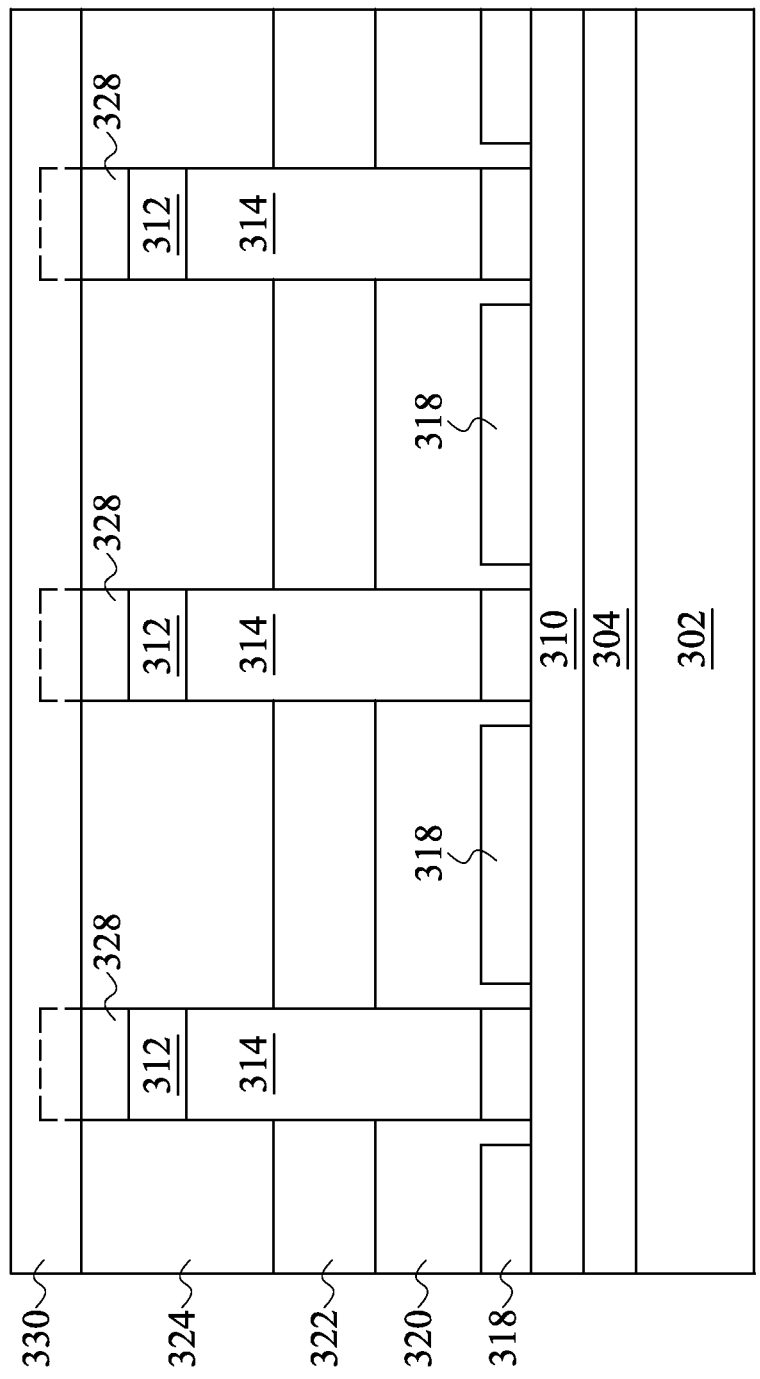
FIG. 3 depicts a plurality of nanowire FETs, where the nanowire FETs have drain silicide materials that are different from source silicide materials, and where a metal layer is formed substantially over the structure to electrically connect drain regions of the nanowire FETs.

FIG. 3 depicts a plurality of nanowire FETs, where the nanowire FETs have drain silicide materials that are different from source silicide materials, and where a metal layer 330 is formed substantially over the structure to electrically connect drain regions 312 of the nanowire FETs. The nanowire FETs may include regions and layers that may be similar to those described above with reference to FIGS. 2A-2L, including a substrate 302, well region 304, source region 310, drain region 312, nanowire channel 314, source silicide 318, first ILD layer 320, gate stack 322, second ILD layer 324, and drain silicide 328. Prior to forming the metal layer 330 substantially over the structure, the structure may be in a suitable state for performing back-end-of-line (BEOL) processing (e.g., depositing an additional ILD layer, etching vias, and patterning metal layers, etc.).

The metal layer 330 may be deposited substantially over the structure, causing an electrical contact between the metal layer 330 and the drain silicide 328. In the example of FIG. 3, a metal used in the metal layer 330 may not be the same as a metal used to form the drain silicide 328. The metal layer 330 may be the first metal layer of a BEOL process (e.g., copper or aluminum, etc.). Because the metal layer 330 may be in contact with the drain silicides 328, the various drain regions 312 of the FETs may be electrically connected.

Figure 4A:
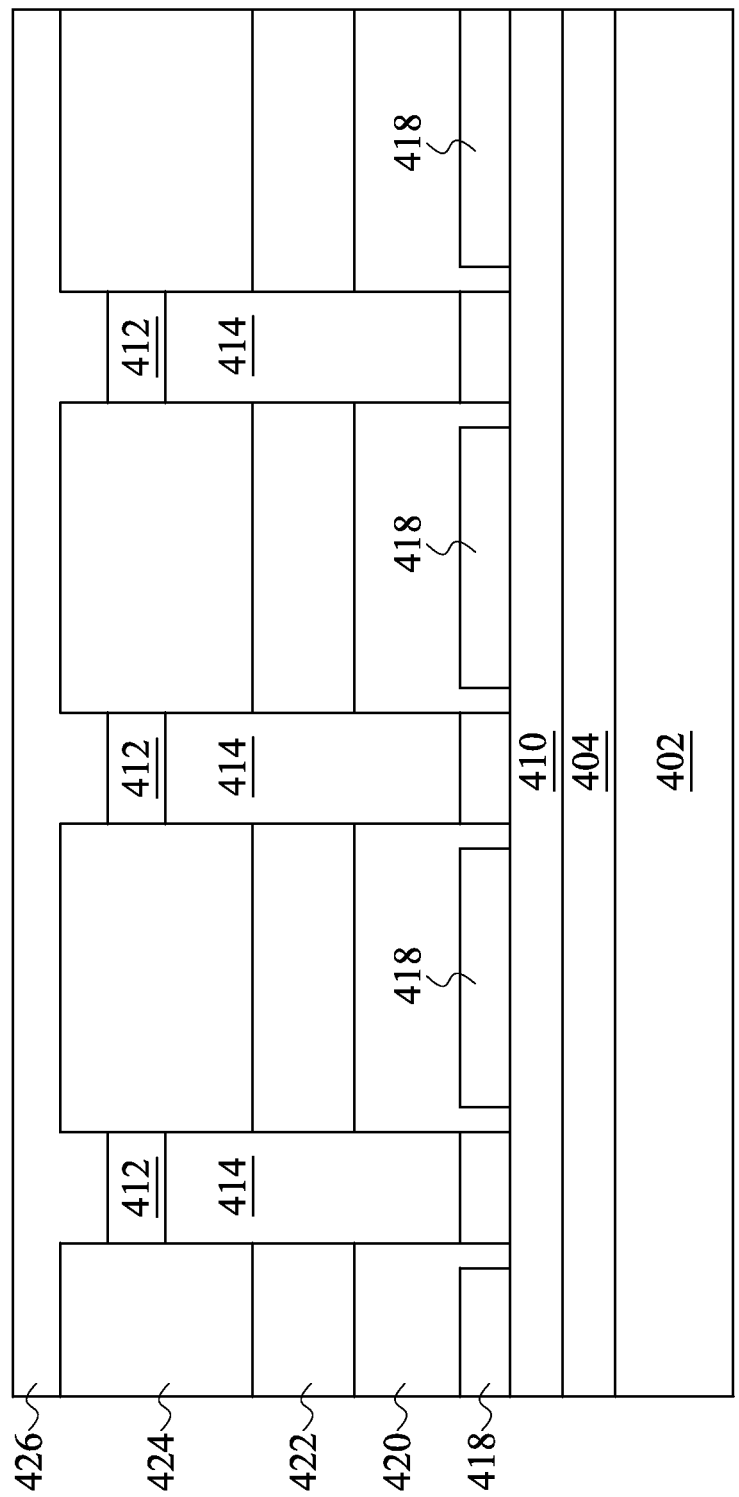
FIG. 4A depicts a deposition of a drain silicide metal substantially over a plurality of nanowire FETs, where the drain silicide metal is formed substantially over drain regions and a second ILD layer of the structure.

FIG. 4A depicts a deposition of a drain silicide metal 426 substantially over a plurality of nanowire FETs, where the drain silicide metal 426 may be formed substantially over drain regions 412 and a second ILD layer 424 of the structure. FIG. 4A may be similar to FIG. 2K (i.e., FIG. 2K may depict a single nanowire FET following deposition of the drain silicide metal 226, whereas FIG. 4A may depict a plurality of nanowire FETs following deposition of the drain silicide metal 426). The drain silicide metal 426 may be, for example, nickel, among other materials. The plurality of nanowire FETs may include regions and layers that may be similar to those described above with reference to FIGS. 2A-2L, including substrate 402, well region 404, source region 410, drain region 412, nanowire channel 414, source silicide 418, first ILD layer 420, gate stack 422, and second ILD layer 424.

Figure 4B:
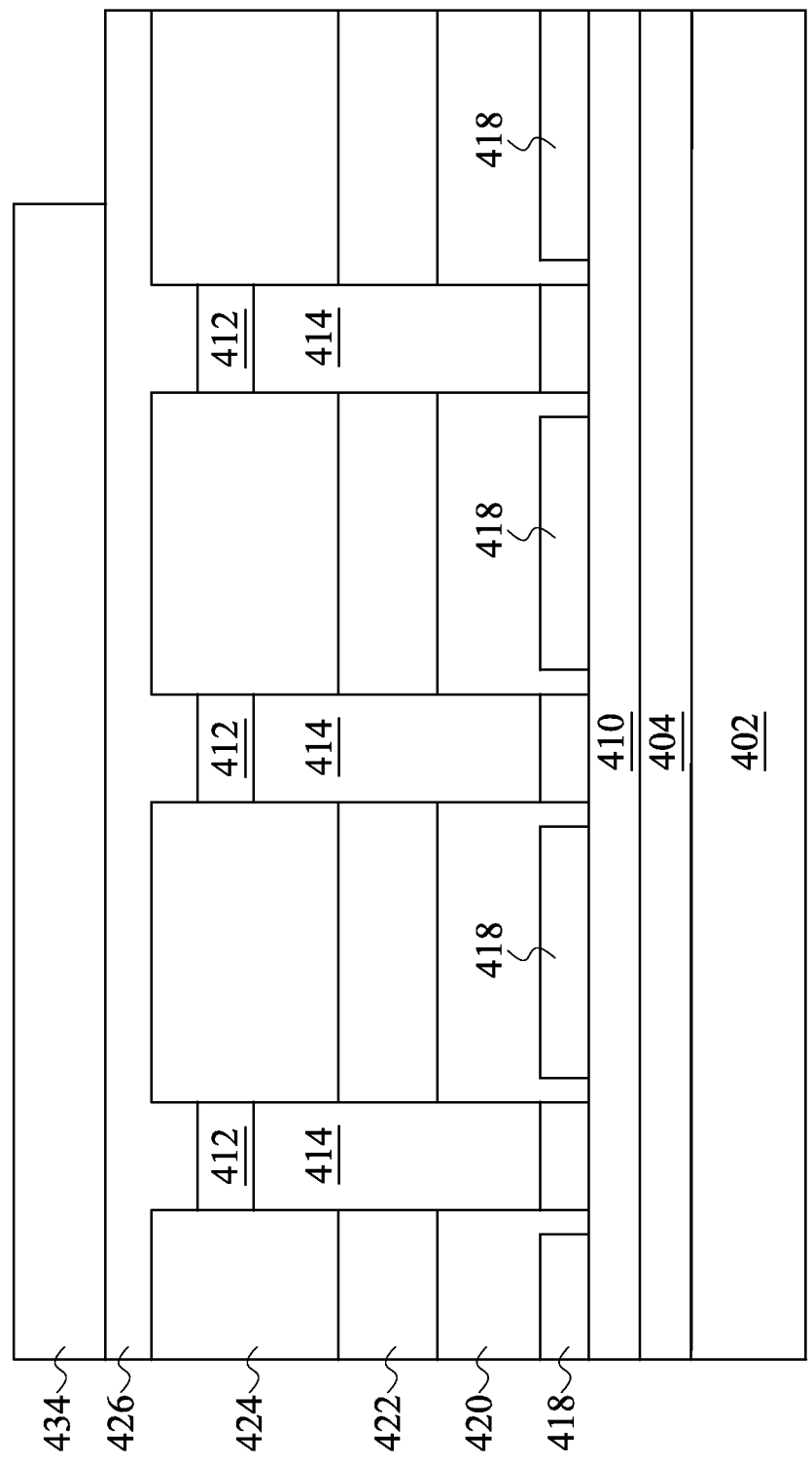
FIG. 4B depicts a deposition and patterning of an amorphous semiconductor layer, where the amorphous semiconductor layer is deposited substantially over the drain silicide metal.

FIG. 4B depicts a deposition and patterning of an amorphous semiconductor layer 434, where the amorphous semiconductor layer 434 may be deposited substantially over the drain silicide metal 426. The amorphous semiconductor layer 434 may include, for example, amorphous silicon or amorphous SiGe. The amorphous semiconductor layer 434 may be patterned, such that the layer 434 may not extend to all portions of the structure, as depicted in FIG. 4B. The amorphous semiconductor layer 434 may be patterned using lithography and etching, and the structure may thereafter be annealed to form a drain silicide (e.g., drain silicide 436, as described below with reference to FIG. 4C).

Figure 4C:
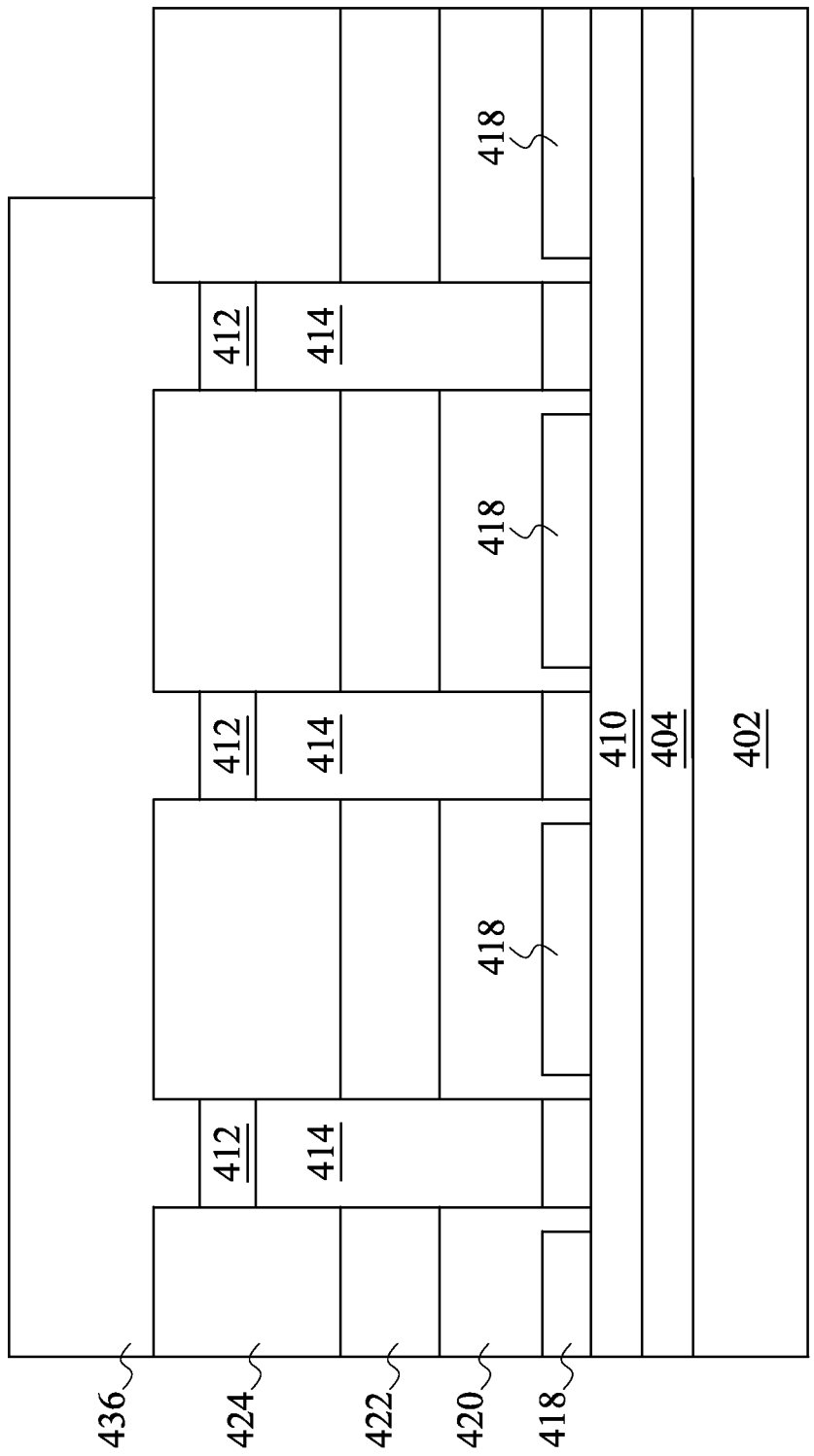
FIG. 4C depicts a drain silicide formed substantially over drain regions of the nanowires and in regions where the amorphous semiconductor layer was present.

FIG. 4C depicts a drain silicide 436 formed substantially over drain regions 412 of the nanowires and in regions where the amorphous semiconductor layer 434 was present. The drain silicide 436 may be formed by annealing the structure and then removing unreacted metal. As illustrated in FIG. 4C, the annealing may cause the drain silicide 436 to be formed substantially on top of the nanowires (e.g., from the reaction between the drain silicide metal 426 and the silicon in the nanowire) and in regions where the amorphous semiconductor layer 434 was present. The drain silicide 436 that may be formed in the regions where the amorphous semiconductor layer 434 was present may cause the drain regions 412 of the nanowire FETs to be electrically connected. As in previous examples, a material comprising the drain silicide 436 may be different from a material comprising the source silicide 418.

Figure 5:
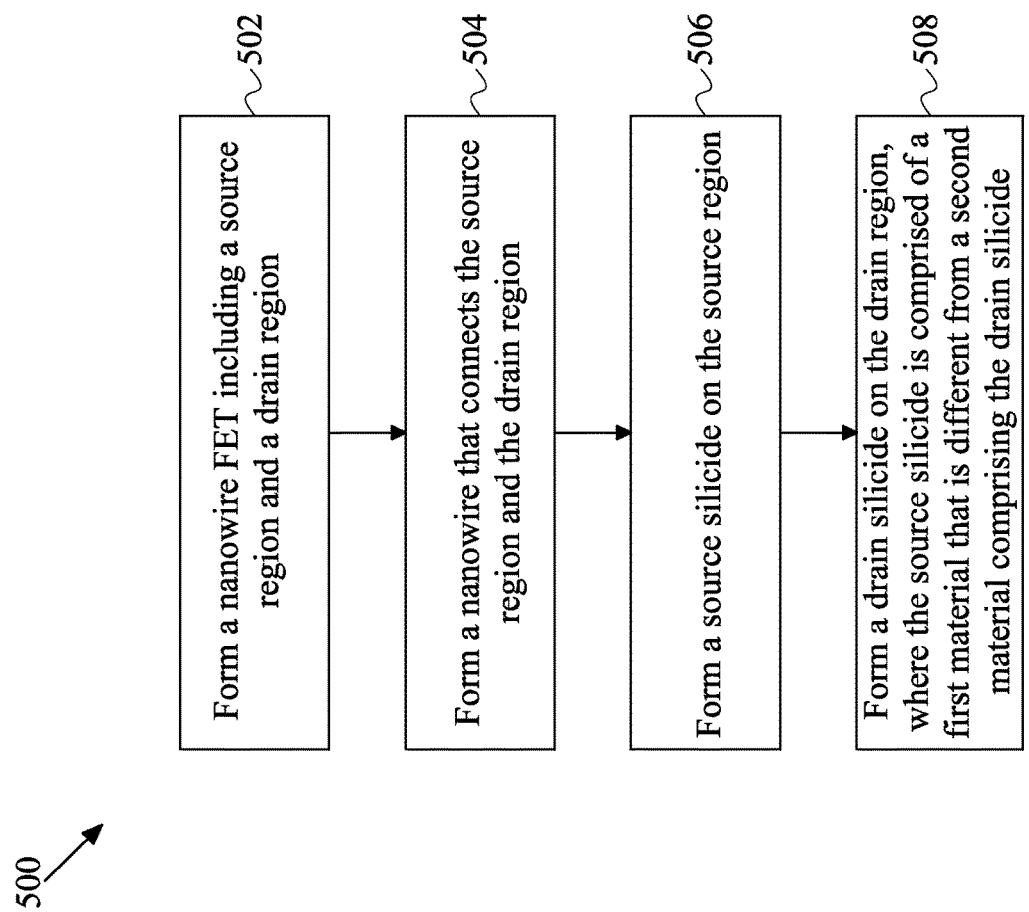
FIG. 5 is a flowchart illustrating an example method for forming a nanowire field effect transistor (FET) device.

FIG. 5 is a flowchart 500 illustrating an example method for forming a nanowire field effect transistor (FET) device. At 502, a nanowire FET including a source region and a drain region may be formed. At 504, a nanowire that connects the source region and the drain region may be formed. At 506, a source silicide may be formed on the source region. At 508, a drain silicide may be formed on the drain region, where the source silicide may be comprised of a first material that is different from a second material comprising the drain silicide.

This written description uses examples to disclose the disclosure, including the best mode, and also to enable a person skilled in the art to make and use the disclosure. The patentable scope of the disclosure may include other examples. It should be understood that as used in the description herein and throughout the claims that follow, the meaning of "a," "an," and "the" includes plural reference unless the context clearly dictates otherwise. Also, as used in the description herein and throughout the claims that follow, the meaning of "in" includes "in" and "on" unless the context clearly dictates otherwise. Further, as used in the description herein and throughout the claims that follow, the meaning of "each" does not require "each and every" unless the context clearly dictates otherwise. Finally, as used in the description herein and throughout the claims that follow, the meanings of "and" and "or" include both the conjunctive and disjunctive and may be used interchangeably unless the context expressly dictates otherwise; the phrase "exclusive of" may be used to indicate situations where only the disjunctive meaning may apply.

It is claimed:

1. A method for forming a nanowire field effect transistor (FET) device, the method comprising:
   forming a nanowire structure over a source region formed over a substrate, the nanowire structure including a protruding portion of the source region, which protrudes from the source region, a channel region disposed on the protruding portion and a drain region disposed on the channel region;
   forming a spacer layer in direct contact with at least a sidewall of the protruding portion;
   after the spacer layer is formed, forming a source silicide layer on the source region other than the protruding portion such that a side surface of the source silicide layer is in contact with a side surface of the spacer layer;
   after the source silicide layer is formed, removing the spacer layer from an entirety of the nanowire structure so that a side face of the protruding portion and the side surface of the silicide layer are exposed; and
   after the spacer layer is removed, forming a drain silicide layer over the drain region in the nanowire structure.

2. The method of claim 1, wherein the source silicide layer is comprised of a first material that is different from a second material comprising the drain silicide layer.

3. The method of claim 2, further comprising, after the spacer layer is formed and before the drain silicide layer is formed, forming a gate stack surrounding the channel region of the nanowire structure.

4. The method of claim 3, further comprising, after the spacer layer is removed and before the gate stack is formed, forming a first dielectric layer over the source region such that the first dielectric layer fills a gap between the source silicide layer and the protruding portion of the source region.

5. The method of claim 4, further comprising, after the gate stack is formed and before the drain silicide layer is formed, forming a second dielectric layer over the gate stack.

6. The method of claim 5, wherein:
   the nanowire structure further includes a hard mask disposed on the drain region, and
   after the second dielectric layer is formed and before the drain silicide layer is formed, the hard mask layer is removed.

7. The method of claim 2, wherein the first material is at least one selected from the group consisting of $MoSi_2$, $WSi_2$, $TiSi_2$, $TaSi_2$ and $NiCoSi_2$.

8. The method of claim 2, wherein the second material is at least one selected from the group consisting of $NiSi_2$ and $PtSi_2$.

9. The method of claim 1, wherein the spacer layer is formed on a sidewall of the channel region and a sidewall of the drain region.

10. The method of claim 1, further comprising, before the source silicide layer is formed, introducing impurities into the source region by an ion implantation operation.

11. A method for forming a nanowire field effect transistor (FET) device, the method comprising:
    forming a nanowire structure over a source region formed over a substrate, the nanowire structure including a protruding portion of the source region, which protrudes from the source region, a channel region disposed on the protruding portion and a drain region disposed on the channel region;
    forming a source silicide layer on the source region other than the protruding portion such that a side surface of the source silicide layer is exposed and faces, with a gap, is in contact with a side surface of the protruding region;
    after the source silicide layer is formed, forming a gate stack surrounding the channel region of the nanowire structure; and
    after the gate stack is formed, forming a drain silicide layer over the drain region in the nanowire structure,
    wherein the side face of the source silicide layer is not in direct contact with the source region.

12. The method of claim 11, wherein the source silicide layer is comprised of a first material that is different from a second material comprising the drain silicide layer.

13. The method of claim 11, further comprising, after the source silicide layer is formed and before the gate stack is formed, forming a first dielectric layer over the source region such that the first dielectric layer fills a gap between a side face of the source silicide layer and a side face of the protruding portion of the source region.

14. The method of claim 13, wherein the first dielectric layer is in contact with the source region and the source silicide layer.

15. The method of claim 13, further comprising, after the gate stack is formed and before the drain silicide layer is formed, forming a second dielectric layer over the gate stack.

16. The method of claim 15, wherein:
    the nanowire structure further includes a hard mask disposed on the drain region, and
    after the second dielectric layer is formed and before the drain silicide layer is formed, the hard mask layer is removed.

17. The method of claim 12, wherein the first material is at least one selected from the group consisting of $MoSi_2$, $WSi_2$, $TiSi_2$, $TaSi_2$ and $NiCoSi_2$.

18. The method of claim 12, wherein the second material is at least one selected from the group consisting of $NiSi_2$ and $PtSi_2$.

19. The method of claim 11, further comprising, before the source silicide layer is formed, introducing impurities into the source region and the drain region by an ion implantation operation.

20. The method of claim 16, wherein the drain silicide layer is formed by:
  forming a metal layer over the drain regions after the hard mask layer is removed;
  depositing amorphous silicon or amorphous germanium over the metal layer; and
  annealing the metal layer and the amorphous silicon or the amorphous germanium to form the drain silicide layer.

* * * * *